(12) United States Patent
Akaishi

(10) Patent No.: US 10,998,585 B2
(45) Date of Patent: May 4, 2021

(54) DETERMINATION METHOD OF SMOKE EMISSION IN BATTERY, AND BATTERY SYSTEM

(71) Applicant: TOYOTA JIDOSHA KABUSHIKI KAISHA, Toyota (JP)

(72) Inventor: Takayuki Akaishi, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 170 days.

(21) Appl. No.: 16/255,145

(22) Filed: Jan. 23, 2019

(65) Prior Publication Data

US 2019/0260092 A1 Aug. 22, 2019

(30) Foreign Application Priority Data

Feb. 21, 2018 (JP) ................................. 2018-028846

(51) Int. Cl.
| | |
|---|---|
| *H01M 10/42* | (2006.01) |
| *G01R 31/36* | (2020.01) |
| *G01R 27/00* | (2006.01) |
| *H01M 10/48* | (2006.01) |
| *G01R 19/00* | (2006.01) |

(52) U.S. Cl.
CPC ........ *H01M 10/4257* (2013.01); *G01R 19/00* (2013.01); *G01R 27/00* (2013.01); *G01R 31/36* (2013.01); *H01M 10/425* (2013.01); *H01M 10/48* (2013.01); *H01M 2010/4271* (2013.01); *H01M 2220/20* (2013.01)

(58) Field of Classification Search
CPC ............. H01M 10/4257; H01M 10/48; H01M 10/425; H01M 2010/4271; H01M 2220/20; H01M 10/486; H01M 10/441; H01M 10/443; H01M 10/482; H01M 2200/103; H01M 10/052; G01R 31/36; G01R 27/00; G01R 19/00; Y02E 60/10
See application file for complete search history.

(56) References Cited

U.S. PATENT DOCUMENTS

| | | | |
|---|---|---|---|
| 2011/0059341 A1* | 3/2011 | Matsumoto | ......... H01M 10/613 429/82 |
| 2012/0276423 A1 | 11/2012 | Asakura et al. | |

FOREIGN PATENT DOCUMENTS

| | | |
|---|---|---|
| JP | 4965750 B2 | 7/2012 |
| WO | 2012/014449 A1 | 2/2012 |

* cited by examiner

*Primary Examiner* — Cynthia K Walls
(74) *Attorney, Agent, or Firm* — Oliff PLC

(57) ABSTRACT

A determination method of smoke emission in a battery includes: calculating first and second internal resistance values, of each of the parallel circuits in first and subsequent second periods, respectively; acquiring a temperature value of each of parallel circuits; and determining the smoke emission in at least one of cells included in one of the parallel circuits, when at least detecting that the one of the parallel circuits has the second internal resistance value smaller than the first internal resistance value, and has an increase in the temperature value within a period defined based on the first and second periods.

4 Claims, 4 Drawing Sheets

DETERMINATION METHOD OF SMOKE EMISSION IN BATTERY, AND BATTERY SYSTEM

INCORPORATION BY REFERENCE

The disclosure of Japanese Patent Application No. 2018-028846 filed on Feb. 21, 2018 including the specification, drawings and abstract is incorporated herein by reference in its entirety.

BACKGROUND

1. Technical Field

The present disclosure relates to a determining method of smoke emission in battery and a battery system mounted on a vehicle or the like.

2. Description of Related Art

A battery module that includes a plurality of batteries (cells) connected in series or in parallel so as to obtain required voltage and capacity is generally used in a vehicle. When abnormality, such as smoke emission, occurs in the cells, it is preferable to detect the abnormality and perform a required safety control. When the cells are connected in parallel, the voltage does not drop even when abnormality occurs in one of the cells. Hence, it is difficult to detect abnormality based only on monitoring of the voltage. WO 2012/014449 discloses a battery system including a plurality of batteries, a smoke discharge channel that exhausts the gas discharged during abnormality of the battery, and a non-return switch including a thermal fuse provided in the smoke discharge channel. The battery system determines occurrence of abnormality when the thermal fuse is blown out.

SUMMARY

In WO 2012/014449, when the thermal fuse of the non-return switch has a disconnection failure, it is hard to distinguish the disconnection failure from a brownout due to high temperature caused by smoke emission from one of the cells. Hence, the determination accuracy is limited. It may be considered to redundantly provide a large number of non-return switches to enhance the determination accuracy, though it leads to cost increase. If the number of cells is increased, a plurality of smoke discharge channels are to be provided. As a result, the number of necessary non-return switches similarly increases.

The present disclosure provides a determination method of smoke emission in a battery, and a battery system, to allow accurate determination of smoke emission in a battery at low costs.

A first aspect of the present disclosure relates to a determination method of smoke emission in a battery, executed by a determination unit of a battery system. The battery system includes: a battery module; a plurality of voltage sensors; a plurality of temperature sensors; at least one current sensor; and a determination unit. The battery module includes a plurality of parallel circuits connected in series, each of the parallel circuits includes a plurality of cells connected in parallel. At least one of the voltage sensors is provided in each of the parallel circuits to measure a voltage of a corresponding one of the parallel circuits. At least one of the temperature sensors is provided in each of the parallel circuits to measure the temperature of a corresponding one of the parallel circuits. The at least one current sensor is provided in the battery module to measure the current of the battery module. The determination unit determines the smoke emission in at least one of the cells. The method includes: calculating of a first internal resistance value and a second internal resistance value; acquiring of a temperature value; and determining of the smoke emission. The calculating is to calculate the first internal resistance value of each of the parallel circuits in a first period, and the second internal resistance value of each of the parallel circuits in a second period subsequent to the first period, based on the voltage value acquired from each of the voltage sensors and a current value acquired from the current sensor. The acquiring is to acquire a temperature value from each of the temperature sensors. The determining is to determine the smoke emission in at least one of the cells included in one of the parallel circuits, when at least detecting that the one of the parallel circuits has the second internal resistance value smaller than the first internal resistance value and has an increase in temperature value, acquired from the temperature sensor, within a period defined based on the first period and the second period.

Thus, smoke emission can accurately be determined based on the increase in temperature and the decrease in internal resistance value at the time of smoke emission.

The first aspect may further include calculating of a third internal resistance value by the determination unit. The third internal resistance value of each of the parallel circuits in a third period subsequent to the second period may be based on the voltage value acquired from each of the voltage sensors and the current value acquired from each of the current sensors. The determination unit may determine the smoke emission in the at least one of the cells included in the one of the parallel circuits, when further detecting that the one of the parallel circuits, having the second internal resistance value smaller than the first internal resistance value, has the third internal resistance value larger than the second internal resistance value, in the determining of the smoke emission in the at least one of the cells included in the one of the parallel circuits.

Thus, determination accuracy can further be enhanced since smoke emission is determined when it is detected that the internal resistance value, which is decreased after smoke emission, increases up to the same level as before the smoke emission.

A second aspect of the present disclosure is a battery system including: a battery module; a plurality of voltage sensors; a plurality of temperature sensors; at least one current sensor; and a determination unit. The battery module includes a plurality of parallel circuits connected in series, each of the parallel circuits includes a plurality of cells connected in parallel. At least one of the voltage sensors is provided in each of the parallel circuits to measure the voltage of a corresponding one of the parallel circuits. At least one of the temperature sensors is provided in each of the parallel circuits to measure the temperature of a corresponding one of the parallel circuits. The at least one current sensor is provided in the battery module to measure the current of the battery module. The determination unit determines smoke emission in at least one of the cells. The determination unit is configured to calculate a first internal resistance value of each of the parallel circuits in a first period, and a second internal resistance value of each of the parallel circuits in a second period subsequent to the first period, based on the voltage value acquired from each of the voltage sensors and a current value acquired from the current sensor, acquire a temperature value from each of the temperature sensors, and determine the smoke emission in at least one of the cells included in one of the parallel circuits, when at least detecting that the one of the parallel circuits has the second internal resistance value smaller than the first internal resistance value and has an increase in temperature value, acquired from the temperature sensor, within a period defined based on the first period and the second period.

Thus, smoke emission can accurately be determined based on the increase in temperature and decrease in internal resistance value at the time of smoke emission.

In the second aspect, the determination unit may be configured to calculate a third internal resistance value of each of the parallel circuits in a third period subsequent to the second period, based on the voltage value acquired from each of the voltage sensors and the current value acquired from each of the current sensors, and determine the smoke emission in the at least one of the cells included in the one of the parallel circuits, when further detecting that the one of the parallel circuits, having the second internal resistance value smaller than the first internal resistance value, has the third internal resistance value larger than the second internal resistance value.

As described above, in the present disclosure, smoke emission is determined based on the increase in temperature and decrease in internal resistance value at the time of smoke emission. Hence, the present disclosure can provide a determination method of smoke emission in a battery and a battery system, which can enhance the determination accuracy since smoke emission and failure of switches or the like can easily be distinguished, and which can achieve cost suppression since the need to provide a large number of switches or the like can be eliminated.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Outline

The determination method of smoke emission in a battery according to the present disclosure includes a step of calculating an internal resistance value of each of the parallel circuits and a step of acquiring a temperature value of each of the parallel circuits in a first period and a subsequent second period. When it is at least detected that any one of the parallel circuits has the internal resistance value of the second period smaller than the internal resistance value of the first period, and has an increase in the temperature value within a period defined based on the first period and the second period, it is determined that one of the cells included in the any one parallel circuit has emitted smoke. Since smoke emission is determined based not only on the increase in the temperature value but also on the decrease in the internal resistance value, the smoke emission can be distinguished from sensor failure or the like, so that determination accuracy can be enhanced.

First Embodiment

Hereinafter, a first embodiment of the present disclosure will be described in detail with reference to the drawings.

Configuration

Figure 1:
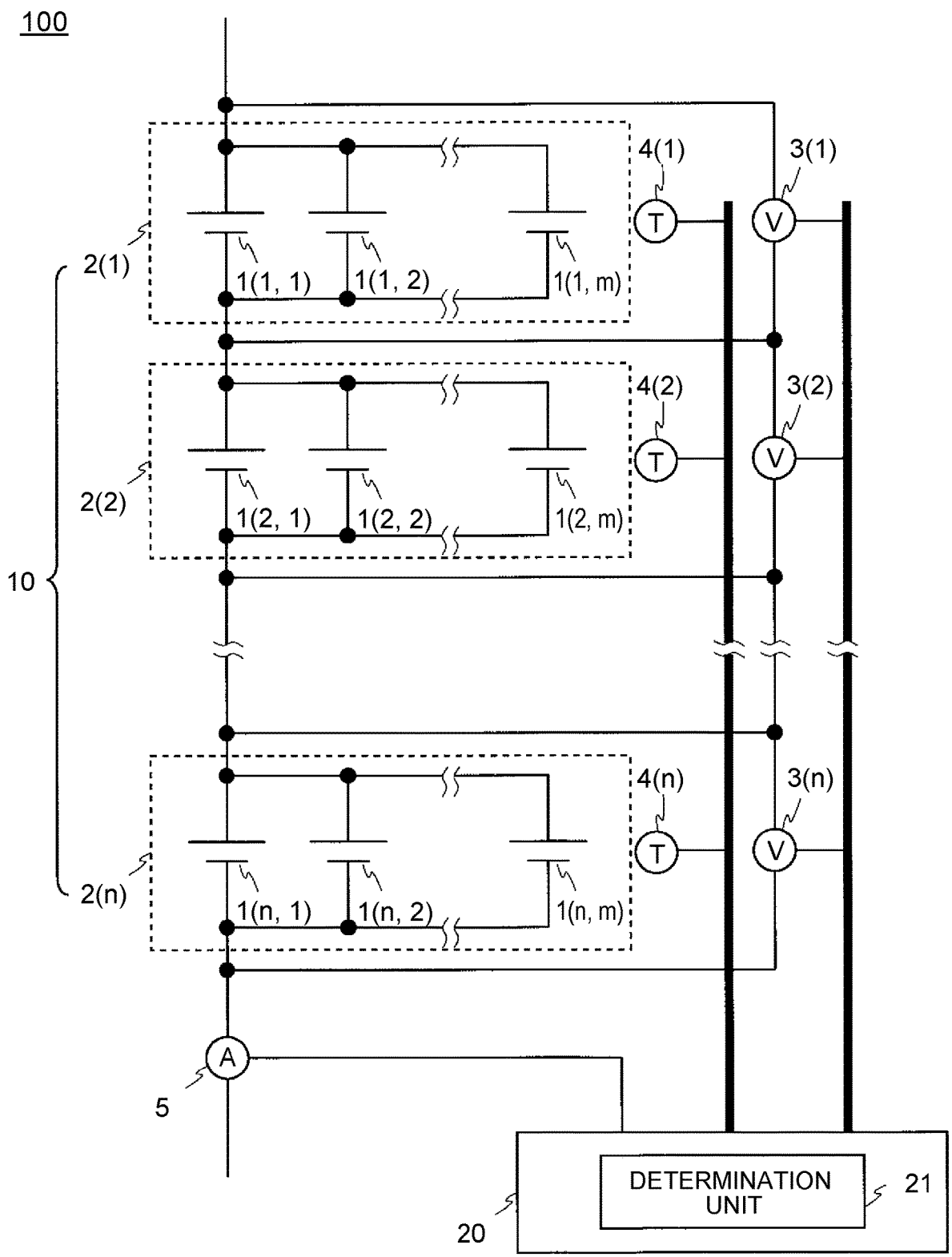
FIG. 1 is a functional block diagram of a battery system according to first and second embodiments of the present disclosure.

FIG. 1 shows a functional block diagram of a battery system 100 according to the present embodiment. The battery system 100 includes a battery module 10, voltage sensors 3, temperature sensors 4, a current sensor 5, and a battery monitoring ECU 20. In one example, the battery module 10 includes n parallel circuits 2 (2(1) to 2($n$)) connected in series. The parallel circuits 2 include m cells 1 (1(1,1) to 1(1, m), ..., 1($n$, 1) to 1($n$, $m$)) connected in parallel. The voltage sensors 3 (3(1) to 3($n$)) measure the voltage of the parallel circuits 2, respectively. The temperature sensors 4 (4(1) to 4($n$)) measure the temperature of the parallel circuits 2, respectively. Two or more temperature sensors 4 may be provided for each of the parallel circuits 2. The current sensor 5 measures the current of the battery module 10.

The battery monitoring ECU 20 is an electronic control unit (ECU) that controls the battery module 10 in one example. The battery monitoring ECU 20 includes a determination unit 21 that acquires measurement values from the voltage sensors 3, the temperature sensors 4, and the current sensor 5, and determines smoke emission in one of the cells based on these measurement values. The battery monitoring ECU 20 may also have another controller for controlling the function, such as charging and discharging of the battery module 10.

Process

Figure 2:
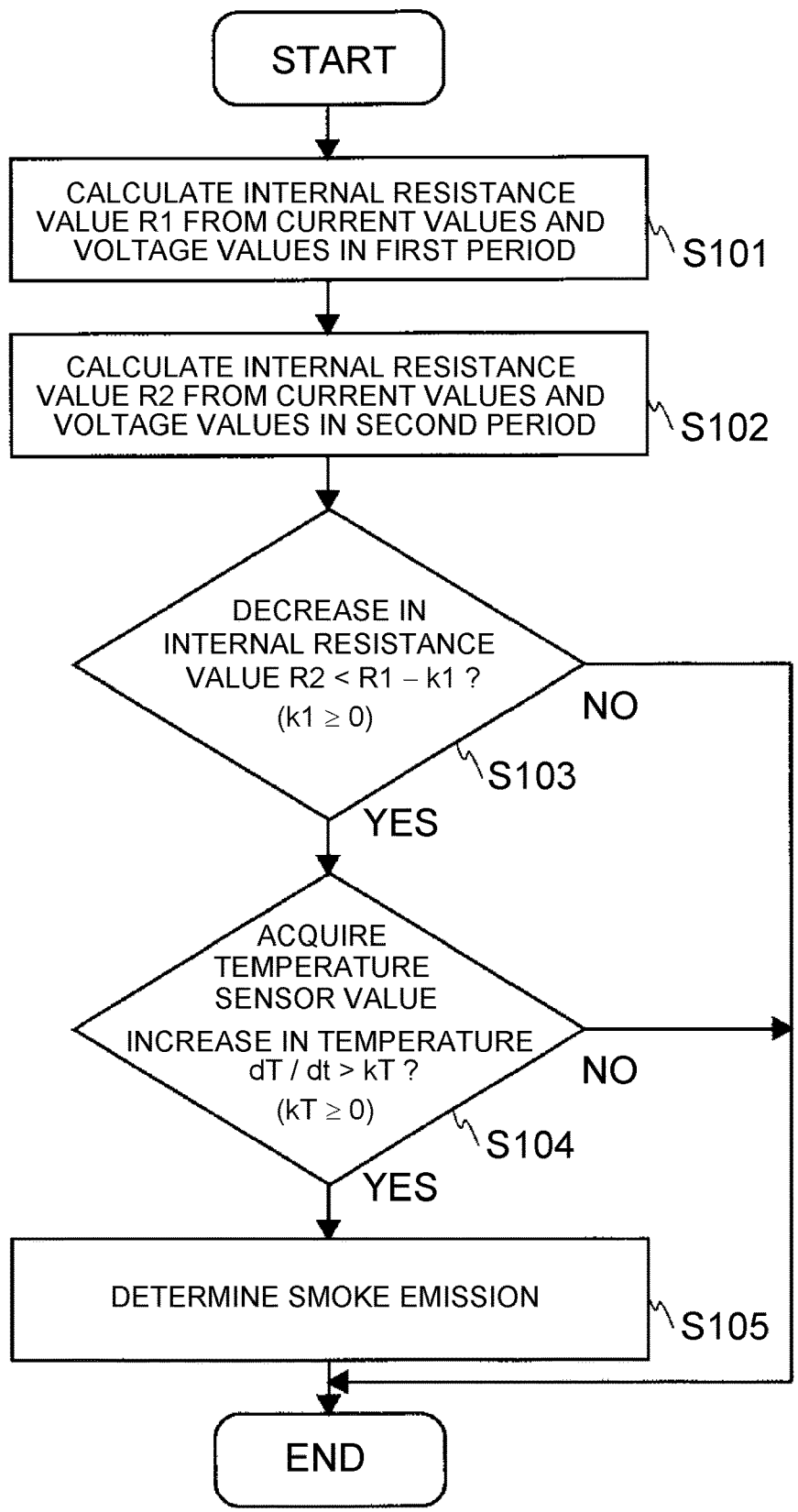
FIG. 2 is a flowchart showing a process of a determination unit according to the first embodiment of the present disclosure.
Figure 3:
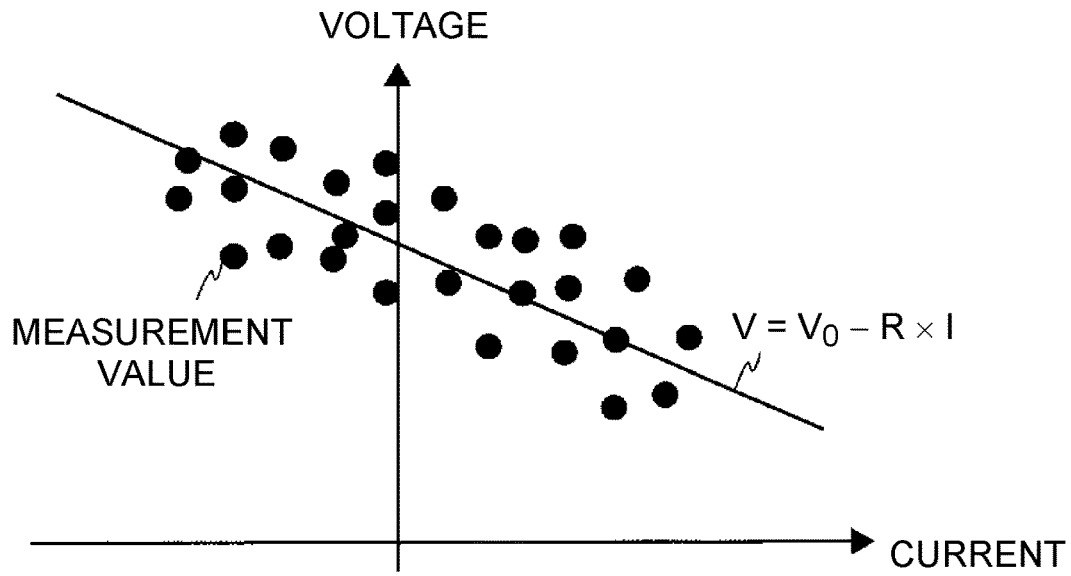
FIG. 3 is a graph view showing a calculation method of an internal resistance value according to the first and second embodiments of the present disclosure.
Figure 4:
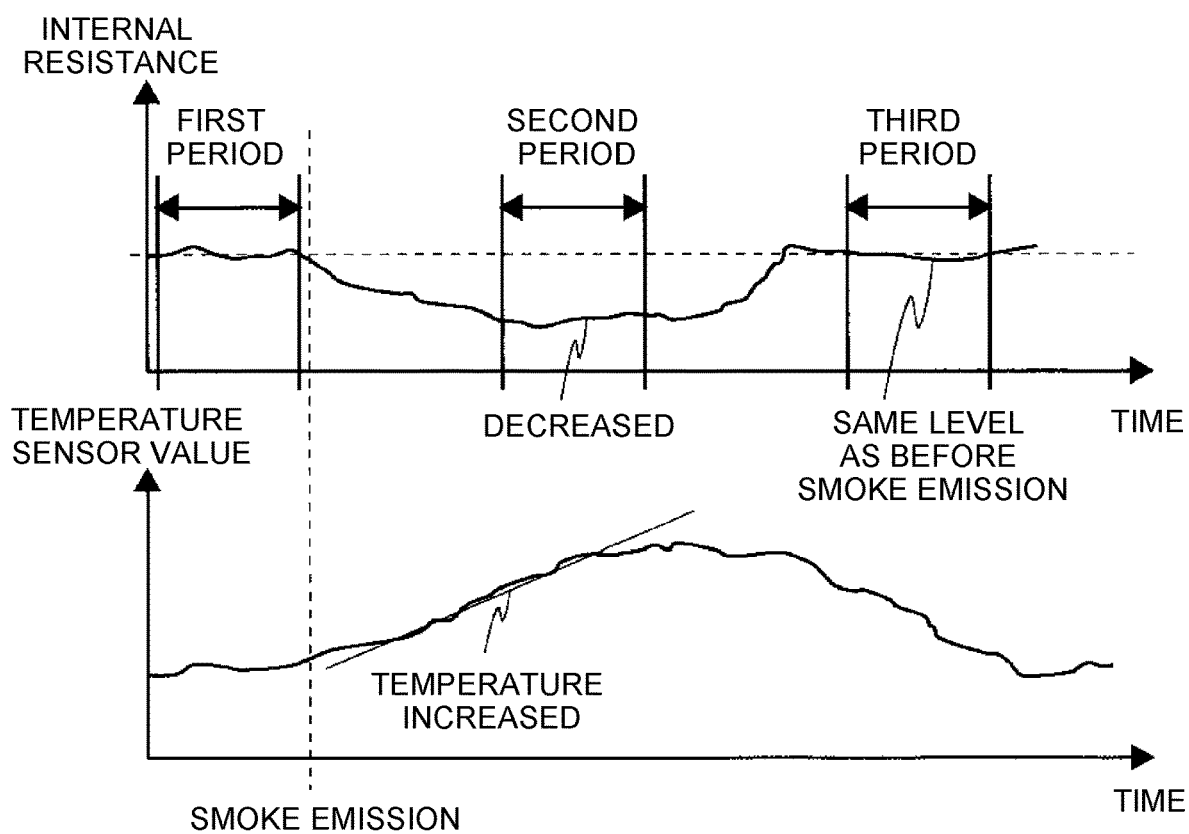
FIG. 4 shows change in internal resistance values and temperature sensor values at the time of smoke emission according to the first and second embodiments of the present disclosure.

Hereinafter, description will be given of a smoke emission determination process executed by the determination unit of the battery system 100. FIG. 2 is a flowchart illustrating the smoke emission determination process. FIG. 3 illustrates a calculation method of an internal resistance value according to the process. FIG. 4 shows change in internal resistance values and temperature sensor values at the time of smoke emission. The process is started when, for example, a vehicle starts traveling, and the battery module 10 starts to be charged and discharged.

In the following description, one parallel circuit 2 is described as a determination target. However, all the parallel circuits 2 may be subjected to determination by performing the same process on each of the parallel circuits 2.

Step S101

The determination unit 21 acquires the voltage of the parallel circuit 2 from the voltage sensor 3, and acquires the current from the current sensor 5 during a specified first period. Based on pairs (I, V) of the current and voltage measurement values acquired during the period, linear approximation to an expression of $V=V_0-R\times I$ is performed by a least square method, or the like, to obtain an inclination R. The obtained inclination R is defined as an internal resistance value R1 (first internal resistance value) of the parallel circuit 2. FIG. 3 shows examples of current-voltage measurement value pairs (I, V) mapped on a current-voltage graph, and a graph of $V=V_0-R \times I$. The inclination R may be calculated a plurality of times, and a time average value thereof may be defined as the internal resistance value R1.

Step S102

The determination unit 21 acquires the voltage of the parallel circuit 2 from the voltage sensor 3 and acquires the current from the current sensor 5 during a specified second period subsequent to the first period, and calculates an internal resistance value R2 (second internal resistance value) of the parallel circuit 2 as in step S101.

Step S103

The determination unit 21 determines whether or not the internal resistance value R2 of the second period is lower than the internal resistance value R1 of the first period. The determination unit 21 may use k1 ($\geq 0$) as a specified constant, and may determine that R2 is lower than R1 when R2 is smaller than R1−k1. When determining that R2 is lower than R1, the determination unit 21 moves to step S104. Otherwise, the determination unit 21 ends the process.

Step S104

The determination unit 21 acquires a temperature T from the temperature sensor 4 provided in the parallel circuit 2. The determination unit 21 acquires the temperature T a plurality of times, calculates a time change dT/dt of the temperature T, and determines whether or not the temperature T is increasing. The determination unit 21 may use kT ($\geq 0$) as a specified constant, and may determine that the temperature T is increasing when dT/dt is larger than kT. When determining that the parallel circuit 2 has an increase in temperature T, the determination unit 21 moves to step S105. Otherwise, the determination unit 21 ends the process.

Here, with reference to FIG. 4, a relationship between smoke emission and change in the internal resistance value, and a relationship between smoke emission and change in temperature are described. When abnormality occurs in one of the cells, and the cell is thereby heated to cause smoke emission, the heat of the cell diffuses to the surrounding cells. When the temperature of the surrounding cells increases, the internal resistance value of the cells decreases, resulting in a decrease in the internal resistance value of the parallel circuit 2. As the heat diffusion progresses, the temperature measured by the temperature sensor 4 increases. For example, when smoke is emitted between the first period and the second period, the internal resistance value R2 during the second period becomes smaller than the internal resistance value R1 during the first period. For a while after the smoke emission, the temperature measured by the temperature sensor 4 increases. Then, as the heat diffuses, the temperature of the cells decreases, so that the internal resistance value increases to the same level as before the smoke emission (third period). The temperature measured by the temperature sensor 4 also decreases to the same level as before smoke emission. When the change in the internal resistance value and temperature is monitored as in steps S103, S104, change patterns at the time of smoke emission can be detected. In consideration of deviation in timing between the change pattern of the internal resistance value and the change pattern of the temperature after smoke emission, the timing for starting and ending the period of acquiring the temperature T in step S104 may be determined in accordance with the characteristics of the battery module 10, that is, for example, based on a specified relative relation of the first period and the second period, in which the internal resistance value is calculated in steps S101, S102. Therefore, step S104 may be processed in parallel with steps S101, S102 where necessary. The length of or intervals between the first period and the second period are appropriately determined such that a decrease in the internal resistance value at the time of smoke emission can preferably be detected in accordance with the characteristics of the battery module 10.

Step S105

The determination unit 21 determines smoke emission in at least any one of the cells 1 included in the parallel circuit 2. The information indicative of the determination result is output to other functional units inside or outside the battery monitoring ECU 20. With this, the process is ended.

It is possible to constantly monitor whether there is smoke emission in the battery module 10 by repeatedly executing the process of steps S101 to S105.

Second Embodiment

A second embodiment of the present disclosure is different from the first embodiment in the process of the determination unit 21. Hereinafter, description is mainly given of the difference from the first embodiment, with the description of the same configurational aspects being skipped.

Process

Figure 5:
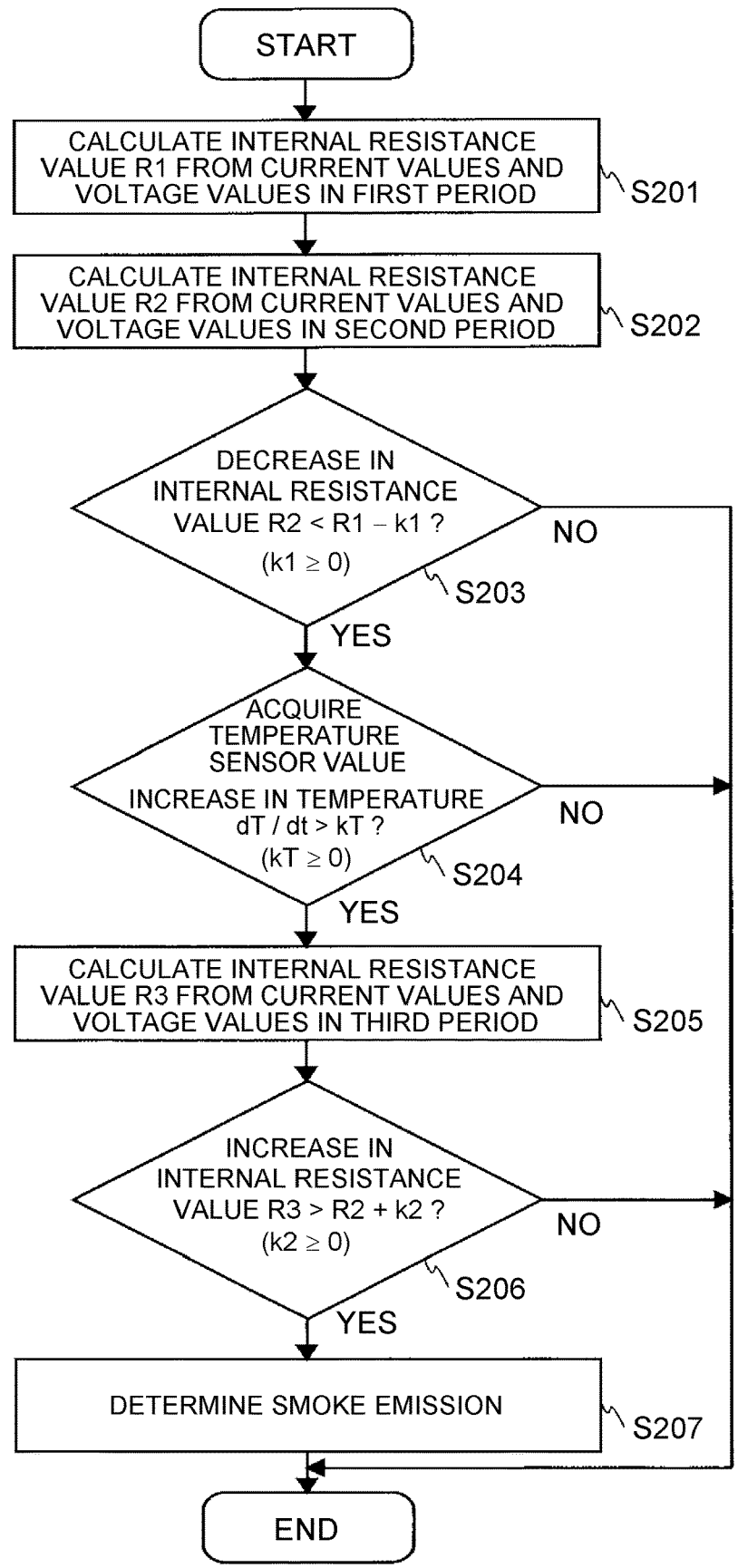
FIG. 5 is a flowchart showing a process of the determination unit according to the second embodiment of the present disclosure.

FIG. 5 is a flowchart illustrating a smoke emission determination process. In the present embodiment, smoke emission is determined by also detecting that the internal resistance value, decreased after smoke emission, increases to the same level as before the smoke emission.

Step S201

The determination unit 21 calculates an internal resistance value R1 of the parallel circuit 2 during a specified first period as in step S101 in the first embodiment.

Step S202

The determination unit 21 calculates an internal resistance value R2 of the parallel circuit 2 during a specified second period subsequent to the first period as in step S102 in the first embodiment.

Step S203

As in step S103 in the first embodiment, the determination unit 21 determines whether or not the internal resistance value R2 of the second period is lower than the internal resistance value R1 of the first period. When determining that R2 is lower than R1, the determination unit 21 moves to step S204. Otherwise, the determination unit 21 ends the process.

Step S204

The determination unit 21 determines whether or not the temperature T of the parallel circuit 2 is increasing as in step S103 in the first embodiment. When determining that the parallel circuit 2 has an increase in temperature T, the determination unit 21 moves to step S205. Otherwise, the determination unit 21 ends the process.

Step S205

By the same method as in step S101, the determination unit 21 calculates an internal resistance value R3 (third internal resistance value) of the parallel circuit 2 during a specified third period subsequent to the second period.

Step S206

The determination unit 21 determines whether or not the internal resistance value R3 of the third period is higher than the internal resistance value R2 of the second period. The determination unit 21 may use k2 ($\geq 0$) as a specified constant, and may determine that R3 is higher than R2 when R3 is larger than R2+k2. When determining that R3 is higher than R2, the determination unit 21 moves to step S207. Otherwise, the determination unit 21 ends the process. When R3 increases to the same level as the value of R1 (values within a specified range including R1), the determination unit 21 may move to step S207.

Step S207

The determination unit 21 determines smoke emission in any one of the cells 1 included in the parallel circuit 2. The information indicative of the determination result is output to other functional units inside or outside the battery monitoring ECU 20. With this, the process is ended.

It is possible to constantly monitor whether there is smoke emission in the battery module 10 by repeatedly executing the process of steps S201 to S207.

The processes of the embodiments described above may properly be changed, as long as smoke emission can be determined based on the decrease in the internal resistance value in addition to the increase in temperature of the battery module. As shown in FIG. 4, smoke emission may also be determined by further detecting that the temperature, increased after smoke emission, decreases to the same level as before the smoke emission.

Effect

According to the present disclosure, smoke emission is determined based not only on the increase in temperature but also on the decrease in the internal resistance value at the time of smoke emission. Hence, as compared with the conventional case where only the temperature increase is detected, it is easy to distinguish between smoke emission and sensor failure or the like. As a result, the determination accuracy of smoke emission can be enhanced. The costs can also be suppressed as compared with the case where a large number of non-return switches including a thermal fuse are provided as in the conventional cases. When an increase in the internal resistance value after the decrease therein is further detected and used for determination, determination accuracy can further be enhanced. A decrease in temperature after the increase in temperature may further be detected and used for determination.

The present disclosure may be defined not only as a determination method of smoke emission in a battery, but also as a determination method of smoke emission executed by a computer, a program, a battery system including such a computer, and a vehicle.

The present disclosure is useful in a battery or battery system mounted on a vehicle, or the like.

What is claimed is:

1. A determination method of smoke emission in a battery, executed by a determination unit of a battery system, the battery system including: a battery module including a plurality of parallel circuits connected in series, each of the parallel circuits including a plurality of cells connected in parallel; a plurality of voltage sensors, at least one of the voltage sensors being provided in each of the parallel circuits to measure a voltage of a corresponding one of the parallel circuits; a plurality of temperature sensors, at least one of the temperature sensors being provided in each of the parallel circuits to measure a temperature of a corresponding one of the parallel circuits; at least one current sensor provided in the battery module to measure a current of the battery module; and the determination unit that determines the smoke emission in at least one of the cells, the method comprising:

calculating a first internal resistance value of each of the parallel circuits in a first period, and a second internal resistance value of each of the parallel circuits in a second period subsequent to the first period, based on a voltage value acquired from each of the voltage sensors and a current value acquired from the current sensor;

acquiring a temperature value from each of the temperature sensors; and determining the smoke emission in at least one of the cells included in one of the parallel circuits, when at least detecting that the one of the parallel circuits has the second internal resistance value smaller than the first internal resistance value and has an increase in the temperature value, acquired from the temperature sensor, within a period defined based on the first period and the second period.

2. The method according to claim 1, further comprising calculating a third internal resistance value by the determination unit, the third internal resistance value of each of the parallel circuits in a third period subsequent to the second period, based on the voltage value acquired from each of the voltage sensors and the current value acquired from each of the current sensors, wherein the determination unit determines the smoke emission in the at least one of the cells included in the one of the parallel circuits, when further detecting that the one of the parallel circuits, having the second internal resistance value smaller than the first internal resistance value, has the third internal resistance value larger than the second internal resistance value, in the determining of the smoke emission in the at least one of the cells included in the one of the parallel circuits.

3. A battery system, comprising:

a battery module including a plurality of parallel circuits connected in series, each of the parallel circuits including a plurality of cells connected in parallel;

a plurality of voltage sensors, at least one of the voltage sensors being provided in each of the parallel circuits to measure a voltage of a corresponding one of the parallel circuits;

a plurality of temperature sensors, at least one of the temperature sensors being provided in each of the parallel circuits to measure a temperature of a corresponding one of the parallel circuits;

at least one current sensor provided in the battery module to measure a current of the battery module; and a computer configured to determine smoke emission in at least one of the cells, the computer being programmed to:

calculate a first internal resistance value of each of the parallel circuits in a first period, and a second internal resistance value of each of the parallel circuits in a second period subsequent to the first period, based on a voltage value acquired from each of the voltage sensors and a current value acquired from the current sensor;

acquire a temperature value from each of the temperature sensors; and determine the smoke emission in at least one of the cells included in one of the parallel circuits, when at least detecting that the one of the parallel circuits has the second internal resistance value smaller than the first internal resistance value and has an increase in the temperature value, acquired from the temperature sensor, within a period defined based on the first period and the second period.

4. The battery system according to claim 3, wherein the computer is programmed to:

calculate a third internal resistance value of each of the parallel circuits in a third period subsequent to the second period, based on the voltage value acquired from each of the voltage sensors and the current value acquired from each of the current sensors; and determine the smoke emission in the at least one of the cells included in the one of the parallel circuits, when further detecting that the one of the parallel circuits, having the second internal resistance value smaller than the first internal resistance value, has the third internal resistance value larger than the second internal resistance value.

\* \* \* \* \*